(12) United States Patent
Kim et al.

(10) Patent No.: US 7,846,502 B2
(45) Date of Patent: *Dec. 7, 2010

(54) METHOD OF POSITIONING PATTERNS FROM BLOCK COPOLYMER SELF-ASSEMBLY

(75) Inventors: Ho-Cheol Kim, San Jose, CA (US); Charles T Rettner, San Jose, CA (US); Sang-Min Park, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 62 days.

This patent is subject to a terminal disclaimer.

(21) Appl. No.: 12/482,583

(22) Filed: Jun. 11, 2009

(65) Prior Publication Data

US 2010/0120252 A1    May 13, 2010

Related U.S. Application Data

(63) Continuation of application No. 12/268,562, filed on Nov. 11, 2008, now Pat. No. 7,560,141.

(51) Int. Cl.
*B05D 3/00* (2006.01)
(52) U.S. Cl. .................. 427/271; 427/256; 427/372.2; 427/385.5; 427/96.1; 427/99.2; 427/98.4
(58) Field of Classification Search ........... 427/271, 427/256, 372.2, 385.5, 96.1, 99.2, 98.4
See application file for complete search history.

(56) References Cited

U.S. PATENT DOCUMENTS 6,777,813 B2   8/2004   Juengling et al.
6,911,400 B2   6/2005   Colburn et al.
7,026,717 B2   4/2006   Juengling et al.
7,090,784 B2   8/2006   Asakawa et al.
2003/0118800 A1   6/2003   Thomas et al.
2006/0134556 A1   6/2006   Nealey et al.
2007/0289943 A1   12/2007   Lu et al.
2008/0038467 A1   2/2008   Jagannathan et al.
2008/0233343 A1   9/2008   Cheng et al.
2008/0311402 A1*  12/2008   Jung et al. ............ 428/409

OTHER PUBLICATIONS

Sang-Min Park, et al., Patterning sub-10 nm line patterns from a block copolymer hybrid. Nanotechnology, vol. 19, 45, (2008), 455304-455310.
Sang-Min Park, et al., Directed assembly of lamellae-forming block copolymers by using chemically and topographically patterned substrates. Advanced Materials, v19 (2007), pp. 607-611.
Frank S. Bates et al., Block Co-polymers—Designer Soft Materials. Physics Today, (Feb. 1999).
Cheolmin Park, et al., Enabling nanotechnology with self assembled block copolymer. Polymer, vol. 44 (2003), pp. 6725-6760.

* cited by examiner

*Primary Examiner*—Michael Cleveland
*Assistant Examiner*—Alex Rolland
(74) *Attorney, Agent, or Firm*—Leander F. Aulisio

(57) ABSTRACT

A method of controlling both alignment and registration (lateral position) of lamellae formed from self-assembly of block copolymers, the method comprising the steps of obtaining a substrate having an energetically neutral surface layer comprising a first topographic "phase pinning" pattern and a second topographic "guiding" pattern; obtaining a self-assembling di-block copolymer; coating the self-assembling di-block copolymer on the energetically neutral surface to obtain a coated substrate; and annealing the coated substrate to obtain micro-domains of the di-block copolymer.

12 Claims, 4 Drawing Sheets

METHOD OF POSITIONING PATTERNS FROM BLOCK COPOLYMER SELF-ASSEMBLY

The present application is a continuation application based on previously filed application Ser. No. 12/268,562, filed on Nov. 11, 2008, now U.S. Pat. No. 7,560,141.

BACKGROUND OF THE INVENTION

The present invention relates generally to the fabrication of integrated circuits and, more particularly, relates to the fabrication of integrated circuits by a patterning process which uses self-assembling polymers.

The semiconductor industry has a need to manufacture integrated circuits (ICs) with higher and higher densities of devices on a smaller chip area to achieve greater functionality and to reduce manufacturing costs. This desire for large-scale integration has led to a continued shrinking of the circuit dimensions and features of the devices.

The ability to reduce the sizes of structures such as gates in field effect transistors (FETs), is driven by lithographic technology which is, in turn, dependent upon the wavelength of light used to expose the photoresist. In current commercial fabrication processes, optical devices expose the photoresist using light having a wavelength of 193 nm (nanometers). Research and development laboratories are experimenting with the EUV (13 nm) wavelength to reduce the size of structures. Further, advanced lithographic technologies are being developed that utilize immersion techniques to improve resolution.

A challenge facing lithographic technology is fabricating features having a critical dimension (CD) below 50 nm. All steps of the photolithographic techniques currently employed must be improved to achieve the further reduction in feature size.

In a conventional lithography technique, light is exposed through a binary mask to a photoresist layer on a layer of material. The photoresist layer may be either a positive or a negative photoresist and can be a silicon-containing, dry-developed resist. In the case of a positive photoresist, the light causes a photochemical reaction in the photoresist. The photoresist is removable with a developer solution at the portions of the photoresist that are exposed through the mask. The photoresist is developed to clear away these portions, whereby a photoresist feature remains on the layer of material. An integrated circuit feature, such as a gate, via, or interconnect, is then etched into the layer of material, and the remaining photoresist is removed.

The line-width of the integrated circuit feature is limited using the conventional lithography process. For example, aberrations, focus, and proximity effects in the use of light limit the ability to fabricate features having reduced linewidth. Using a 248 nm wavelength light source, the minimum printed feature linewidth is between 300 and 150 nm, using conventional techniques. The most advanced lithography tools can now resolve to 100 nm feature size which can be improved to 70 to 80 nm with immersion lithography. With IC design expected to require sub-50 nm interconnects, it is apparent that conventional lithography cannot meet this design requirement.

Accordingly there is a need for reducing the IC interconnect opening diameter to below the resolutions of the conventional lithographic tools, to improve circuit layout density.

SUMMARY OF THE INVENTION

It has been known that certain materials are capable of organizing into ordered patterns under certain desired conditions, which is typically referred to as the self-assembly of materials.

The present invention relates to a method of controlling the lateral position of lamellar lines in a trough pattern having energetically neutral bottom and sides by the introduction of two levels of topographic patterns on a substrate. Control of both alignment and lateral position of the lamellae is obtained.

In the method, two levels or layers of topographic patterns are formed on a suitable substrate. Preferably, both levels (layers) of topographic patterns are prepared from a photosetting polymer, which can be the same or different for each level. An example of a suitable substrate is a silicon wafer having a thin layer of silicon dioxide disposed thereupon. Of the two levels or layers formed on the substrate, the layer closest to the substrate (first topographic pattern) is preferably formed last. The first topographic "phase pinning" pattern is formed by cutting away a part of the surface of the second topographic "guiding" pattern after the second topographic "guiding" pattern is formed on the suitable substrate. In an alternative embodiment, the first topographic "phase pinning" pattern is formed before the second topographic pattern.

The first topographic "phase pinning" pattern is formed so as to contain a mesa having an edge. Alternatively, the first topographic "phase pinning" pattern can be in the shape of a ledge, wherein the ledge comprises an overhang. The surface comprising both the first topographic "phase pinning" pattern and the second topographic "guiding" pattern is then made energetically neutral by methods known to one of ordinary skill in the art. An energetically neutral surface, which includes at least the sidewalls and the bottom of the trench patterns, provides for the later formation of lamellar micro-domains from a self assembling di-block copolymer. The lamellar micro-domains, which have alternating blocks of different compositions, are substantially perpendicular to the sidewalls of the trench patterns.

The layer further removed from the substrate is a second topographic "guiding" pattern. The second topographic "guiding" pattern resides substantially on top of the first topographic pattern, thus forming a composite comprising substrate/first topographic pattern/second topographic pattern. The second topographic pattern comprises at least one trough. The at least one trough can have a shape of a line, an arc, an angle, a combination thereof or the like. The at least one trough contains at least one open end. Thus, the at least one trough cannot be completely closed off like a box structure. Preferably, the at least one trough contains an opening at both ends of the trough; that is, the trough is open at both ends. Open end(s) of the at least one trough are positioned close enough to the first topographic "phase pinning" pattern so that one block of a di-block copolymer can be pinned to the edge. This allows positioning the starting point of line-forming lamellar micro-domains in the trough. The lateral position (registration) of the lamellae is thus controlled.

After formation of first and second topographic patterns, and also making the surfaces of said topographic patterns energetically neutral, a solution or dispersion, comprising a block copolymer, or a blend of two or more block copolymers, and a solvent such as toluene, is spun cast onto the composite comprising substrate/first topographic pattern/second topographic pattern. One block of the di-block copolymer is "pinned" to the edge of the mesa. This "pinning" action controls the registration (lateral position) of the lamellae in the trough.

It is theorized that the block that is more likely to bend has a tendency to "curve around" the edge, or the ledge, of the mesa, thus substantially "pinning" the self-assembling di-block copolymer. In the case of PS-b-PMMA, the styrene block cannot bend as readily as the methylmethacrylate block; and thus the methylmethacrylate block is "pinned" by the edge of the mesa. The spun cast di-block copolymer, preferably PS-b-PMMA, is then annealed to obtain equilibrium morphology. An etching step can then be performed on the assembly of lamellae to obtain a line/space array. The line/space array, which is formed perpendicular to the sidewalls of the trench, has a sublithographic dimension.

DETAILED DESCRIPTION OF THE INVENTION

Figure 1:
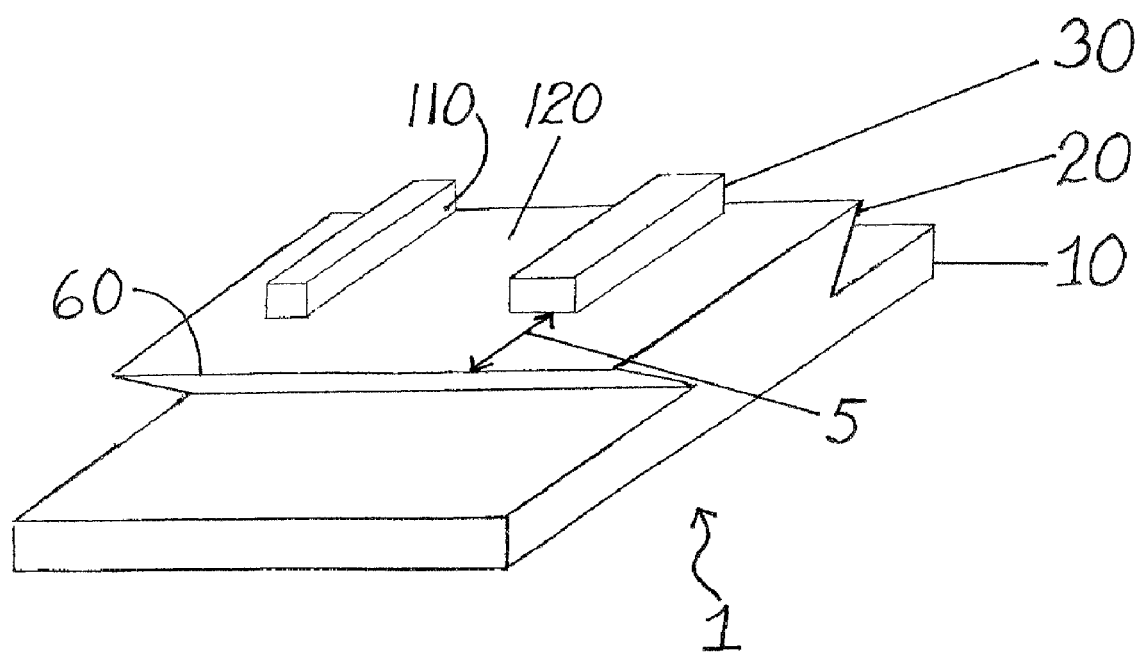
FIG. 1 is a schematic representation of a first topographic laminate that comprises a substrate, a first topographic pattern that acts as a phase pinning pattern, and a second topographic pattern that acts as a guiding pattern.

A monomer as used herein is a molecule that can undergo polymerization thereby contributing constitutional units to the essential structure of a macromolecule, an oligomer, a block, a chain and the like.

A polymer as used herein is a macromolecule comprising multiple repeating smaller units or molecules (monomers) bonded together covalently. The polymer may be a natural polymer or a semi-synthetic polymer or a fully synthetic polymer.

A copolymer as used herein is a polymer derived from more than one chemical species of smaller unit or monomer.

A block copolymer as used herein is a copolymer that comprises more than one species of monomer, wherein the monomers are present in homogenous larger units or blocks. Each block of the specific monomer comprises repeating sequences of only that monomer, uninterrupted by other monomers. A formula (1) representative of a block copolymer is shown below:

$$-(A)_a\text{-}(B)_b\text{---}(C)_c\text{-}(D)_d\text{-} \quad (1)$$

wherein A, B, C and D represent different monomer units and the subscripts "a", "b", "c" and "d" represent the number of repeating units of A, B, C and D respectively. The above referenced representative formula is not meant to limit the structure of the block copolymer used in an embodiment of the present invention. The aforementioned monomers of the copolymer may be used individually and in combinations thereof in accordance with the method of the present invention.

A di-block copolymer has blocks of two different polymers. A formula (2) representative of a di-block copolymer is shown below:

$$-(A)_m\text{-}(B)_n\text{-} \quad (2)$$

where subscripts "m" and "n" represent the number of repeating units of A and B, respectively. The notation for a di-block copolymer may be abbreviated as A-b-B, where A represents the polymer of the first block, B represents the polymer of the second block, and -b- denotes that it is a di-block copolymer of blocks A and B. For example, PS-b-PEO represents a di-block copolymer of polystyrene (PS) and poly(ethylene oxide) (PEO).

A crosslinkable polymer as used herein is a polymer having a small region in the polymer from which at least one polymer chain may emanate, and may be formed by reactions involving sites or groups on existing polymers or may be formed by interactions between existing polymers. The small region may be an atom, a group of atoms, or a number of branch points connected by bonds, groups of atoms or polymer chains.

Typically, a crosslink is a covalent structure, but the term is also used to describe sites of weaker chemical interactions, portions of crystallites and even physical interactions such as hydrogen bonding, phase separation and entanglements.

Morphology as used herein describes a form, a shape, a structure and the like of a substance, a material and the like as well as other physical and chemical properties (eg., Young's Modulus, dielectric constant, etc. as described infra).

Amphiphilic as used herein is used to describe a molecule and a macromolecule that is or has in part both polar and non-polar portions that constitute the molecule and the macromolecule.

Thermosetting polymer as used herein is a polymer or a prepolymer in a soft solid or viscous state that changes irreversibly into an infusible, insoluble polymer network by curing. Typically, curing can be by the action of heat or radiation causing the production of heat, or both. Further, curing can be by the action of heat and/or radiation that produces heat resulting in the generation of a catalyst which serves to initiate crosslinking in the region of exposure.

Photosetting polymer as used herein is a polymer or a prepolymer in a soft solid or viscous state that changes irreversibly into an infusible, insoluble polymer network by curing. Typically, curing can be by the action of exposing the polymer or prepolymer to light (UV, IR, visible, etc.). Further, curing can be by the action of exposure to radiation resulting in the generation of a catalyst which serves to initiate crosslinking in the region of the exposure.

Nanostructure as used herein is a structure on the order of 1 nanometer (nm) to 100 nm in dimension. Examples of the structure may include, but are not limited to, nanorods, nanosheets, nanospheres, nanocylinders, nanocubes, nanoparticles, nanograins, nanofilaments, nanolamellae and the like, having solid composition and minimal structural dimension in a range from about 1 nm to about 100 nm. Further examples of the structure may include but are not limited to spherical nanopores, cylindrical nanopores, nanotrenches, nanotunnels, nanovoids and the like, having ther void or shape defined by the material or matrix that surrounds them and having a diameter in a range from about 1 nm to about 100 nm.

A substrate as used herein is a physical body (eg., a layer or a laminate, a material and the like) onto which a polymer or polymeric material may be deposited or adhered. A substrate may include materials of the Group I, II, III and IV elements. It may also include plastic material, silicon dioxide, glass, fused silica, mica, ceramic, metals deposited on the aforementioned substrates, combinations thereof and the like.

An energetically neutral surface layer as used herein is a surface layer whose chemical and morphological composition affords substantially no preferential or selective affinity for either polymer block in a block copolymer or an associated functional group or moiety, such as through ionic bonds, dipole-dipole forces, hydrogen bonding and similar intermolecular forces.

A mesa as used herein is an isolated plateau or hill having abrupt or steeply sloping sides and a level top. A mesa as used herein can also be a broad terrace with an abrupt slope or escarpment on one side.

A trough as used herein is a structural depression that is long and narrow or shallow. The structural depression such as a canal or channel has a bottom or floor which is substantially horizontal; and has two opposing sides, the sides being substantially parallel to one another and being separated from one another by a distance that is substantially the distance of the width of the canal or channel. The two opposing sides are substantially perpendicular to the bottom or floor of the canal or channel.

A lamellar micro-domain as used herein is topographic structure of alternating rows or columns of a block copolymer having at least two different polymeric blocks.

A lamellar micro-domain period (P) as used herein is the distance between two adjacent lamellar micro-domains.

An edge as used herein is that linear or curved part of a mesa that is between the steeply sloping side of the mesa and the level top of the mesa.

A ledge as used herein is a type of mesa that has an edge which is in the shape of a "springboard", that is, the ledge has a thin section that juts out from the rest of the mesa to form an overhang.

Alignment is a forming in line of elements, each element having a correct relative position. Alignment as used herein is the position of the self-assembled micro-domains in the trough with respect to the sides of the trough.

Registration is a bringing together of two things where there is complete agreement with respect to position. Registration as used herein is the position of the self-assembled micro-domains in the trough with respect to the end (or ends) of the trough.

Self-assembling polymers are capable of self-organizing into nanometer-scale patterns, enabling future advances in semiconductor technology as shown for example in Nealey et al., "Self-assembling resists for nanolithography" Electron Devices Meeting. 2005. IEDM Technical Digest. IEEE International 5-7 Dec. 2005 Page(s): 4 pp. As described in this reference, each self-assembling polymer system typically contains two or more different polymeric block components that are immiscible with one another. Under suitable conditions, the two or more immiscible polymeric block components separate into two or more different phases on a nanometer scale and thereby form ordered patterns of isolated nano-sized structural units. U.S. Patent Application Publication 2005/0167838 discloses the use of a self-assembled polymer pattern to form sub-lithographic features in an oxide.

The block copolymers as mentioned hereinabove preferably comprise A:B block copolymers wherein A is a first polymeric component and B is a second polymeric component having a weight ratio of A:B from about 20:80 to about 80:20. The single unit polymer block preferably comprises cylindrical or lamellar micro-domains. The block copolymer may be an organic block copolymer. In the A-b-B scenario, specific examples of the A block are (but not limited to): poly(ethylene oxide), poly(ethylene glycol), poly(propylene glycol), poly(alkylene oxides), poly(acrylic acids), poly (methacrylic acids), poly(dimethylaminoethylmethacrylate), poly(hydroxyalkylmethacrylates), poly(alkylene oxidemethacrylates), poly(hydroxystyrene), carbohydrate polymers, poly(vinylalcohols), poly(ethylene imines), polyoxazolines, polypeptides, poly(vinylpyridines), polyacrylamides, poly(methylvinylethers), poly(vinylcarboxylic acid amides), poly(N,N-dimethylacrylamides) and the like. Specific examples of the B block are (but not limited to) polystyrene, poly(alpha-methyl styrene), polynorbornene, polylactones, polylactides, polybutadiene, polyisoprene, polyolefins, polymethacrylates, polysiloxanes, poly(alkyl acrylates), poly(alkyl methacrylates), polyacrylonitriles, polycarbonates, poly(vinylacetates), poly(vinylcarbonates), polyisobutylenes and the like. The block copolymers can be readily selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). In a particularly preferred, but not necessary, embodiment of the present invention, the block copolymers comprise PS-b-PMMA.

An energetically neutral surface can induce the lamellae-forming block copolymer to align perpendicularly with respect to the sidewalls of the trough that is formed as part of the second topographic pattern. This alignment is achieved because lamellae of the polymer blocks A and B of the di-block copolymer can self-assemble, being induced to align perpendicular to the sidewalls of the trough pattern. The same alignment principle can be applied to formation of line-forming morphology with respect to parallel cylinders. As an example, for a trough with energetically neutral sidewalls and a preferentially wetted substrate, cylinder forming block copolymers may be used to generate lines substantially normal to the trough sidewalls.

Rod-coil block copolymers such as poly(hexyl-isocyanate)-b-polystyrene and poly(phenyl-quinoline)-b-polystyrene can be used to form films wherein the high stiffness of one of the domains of such block copolymers induces alignment of line-forming structures substantially normal to the sidewalls of the trough.

Rigidity of a particular polymer block in the di-block copolymer can be controlled by combining the di-block copolymer with a third, miscible material. The third material is miscible with the particular block of the di-block copolymer. The miscible material can act as a stiffening compound, increasing the rigidity of that particular block of the di-block copolymer. If the miscible material is crosslinkable, then the structure formed by the alignment of the line-forming micro-domains can be made substantially permanent as by crosslinking.

After the film of lamellar micro-domains is formed, at least one micro-domain can be removed from the film to obtain an oriented structure comprising a line/space array. Removal of the micro-domain can be obtained by various methods known to one of ordinary skill in the art. Such methods are thermolysis, UV/ozone processing, supercritical $CO_2$ processing, solvent extraction, dry etching, reactive ion etching (RIE), wet etching and the like. Processes can also be employed in combination. Removing at least one micro-domain can comprise removing at least one domain from one or more polymer blocks of the di-block copolymer. In one example, in the case of di-block copolymers, removal of only the first block, only the second block, or both first and second blocks can be employed.

If a miscible material is employed in one block of the di-block copolymer, then both blocks can be removed, leaving the miscible material in the at least one trough. The miscible material in the trough forms an oriented structure. Preferably, the oriented structure is a nanostructure.

An example of employing a miscible material is using polymethylsilsesquioxane (PMSSQ). The PMSSQ can be mixed with a di-block copolymer of polystyrene and poly (ethyleneoxide) (PS-b-PEO). In a preferred embodiment, the molecular weight of the PS block is about 19,000 grams/mole (g/mol); and the molecular weight of the PEO block is about 12,000 grams/mole. The composition of the PS-b-PEO can vary in the amount of PS block and PEO block present in the di-block copolymer. The molecular weight of each block of the di-block copolymer can be in a range from about 2,000 g/mol to about 100,000 g/mol. The total molecular weight of the di-block copolymers can range from about 10,000 to about 200,000 g/mol. The fraction of monomer blocks present can be represented in percent millimoles (% mmol), percent by weight (wt %), volume fraction or the like. The combined volumetric fraction of the PEO (with miscible PMSSQ) block present in the di-block copolymer is preferably about 0.65. The PMSSQ is preferentially miscible with the PEO block of the PS-b-PEO over the PS block. The PMSSQ can act as a stiffening agent to increase the rigidity of the PEO block both in the di-block copolymer and in the PEO micro-domains in the formed film that is present in the trough.

The trough can be prepared using electron beam (e-beam) lithography. Alternatively, other processes such as chemical vapor deposition (CVD), plasma deposition, stereolithography, photolithography, sputtering, nanoimprinting and the like can be employed to create the at least one trough in the second topographic pattern. It is necessary that any open end of the trough be positioned relatively close to the edge of the mesa or ledge found in the first topographic pattern. The distance between an open end of the trough and the edge of the mesa can be expressed in terms of a lamellar domain period (P). The lamellar domain period (P) of a di-block copolymer that can form micro-domains can be defined as the distance between two adjacent micro-domains. The distance between the open end of a trough found in the second topographic pattern and the edge of a mesa found in the first topographic pattern is, in a preferred embodiment, about 0.5 P to about 1.0 P, whereby the at least one edge acts to pin one block of the di-block copolymer. Preferably, the width of the trough is about 100 nanometers to about 500 nanometers. More preferably, the width of the trough is about 200 nanometers to about 400 nanometers. Most preferably, the width of the trough is about 300 nanometers.

A trough in the second topographic pattern can be made energetically neutral by deposition of a thin film of appropriate chemical composition. The process of making the surfaces energetically neutral can be any process known to one of ordinary skill in the art. One method of making the topographic surface neutral to both blocks of a di-block copolymer is by forming a random copolymer brush coating on the surface. If the di-block copolymer is a PS-b-PMMA copolymer, then a random brush copolymer of PS-PMMA is anchored to the surface of the pre-patterned topographic surface. Other methods of making the topographic surfaces neutral to both blocks of the di-block copolymer are: coating with self-assembled mono-layers, coating with thermally crosslinkable polymer films, and coating with photochemically crosslinkable polymer films. The entire surface of the substrate containing both topographic patterns can be made energetically neutral. At the very least, both sidewalls of the trench and the bottom of the trench must be made energetically neutral.

The formation of self-assembled structures (nanostructures) of line-forming micro-domains can be accomplished by forming a film on an energetically neutral substrate by a process selected from the group consisting of spin casting, dip coating, spray coating, thermal annealing, vapor annealing, combinations thereof and the like. Examples of line-forming micro-domains are lamellar micro-domains and cylindrical micro-domains.

After the surface of the substrate is made energetically neutral, a self assembling di-block copolymer is coated onto the surface of the substrate to obtain a coated substrate. The coated substrate is then heated, as by an annealing step, to a temperature that is below the melting point temperature of the di-block copolymer. A self assembled di-block copolymer having lamellar microdomains within the trough is obtained.

The present invention relates to a method for preparing a pattern consisting essentially of an array of substantially parallel lines from self-assembly of polymeric micro-domains. The array of lines has a sub-lithographic dimension. The process comprises a first step of providing a substrate having an energetically neutral surface layer. The energetically neutral surface layer comprises at least one mesa integrally disposed thereon, and at least one trough integrally disposed thereon. The mesa has at least one edge. The at least one trough comprises a bottom surface, a substantially planar first sidewall and a substantially planar second sidewall opposite the first sidewall. The first sidewall and the second sidewall are substantially normal to the surface layer. The first and second sidewalls are separated by a distance corresponding to the width of the bottom surface of the trough. The at least one trough has at least one open end. The process comprises a second step of providing a linear substantially symmetrical A-b-B di-block copolymer. The process further comprises a third step of forming a film comprising the A-b-B di-block copolymer inside the at least one trough. The lateral position of a line-forming micro-domain in the trench is controlled by the distance between the at least one open end of the trough and the at least one edge of the mesa. The distance is about 0.5 P to about 1.0 P, wherein the symbol P refers to the lamellar domain period of the A-b-B di-block copolymer. The edge pins one block of the di-block copolymer. The process further comprises a fourth step of assembling line-forming micro-domains of the di-block copolymer within the film. The micro-domains form self-assembled structures. Preferably, the micro-domain structures are nanostructures. The structures are oriented substantially normal to the first sidewall and second sidewall. The process comprises a fifth step of removing at least one micro-domain from the film to obtain an oriented structure in the trough. The oriented structure is substantially normal to the first sidewall and the second sidewall, and substantially perpendicular to the surface layer. The oriented structure comprises a pattern consisting essentially of an array of substantially parallel lines. The array of substantially parallel lines has a sub-lithographic dimension. Preferably, the array of substantially parallel lines is a nanoarray. The oriented structure (nanoarray of substantially parallel lines) is controlled in both alignment and registration (lateral position within the trough).

The present invention relates to an oriented structure prepared according to the following process. The process comprises a first step of providing a substrate having an energetically neutral surface layer. The energetically neutral surface layer comprises at least one mesa integrally disposed thereon.

The mesa has at least one edge. At least one trough is integrally disposed on the mesa. The at least one trough comprises a bottom surface, a substantially planar first sidewall and a substantially planar second sidewall opposite the first sidewall. The first sidewall and the second sidewall are substantially normal to the surface layer. The first and second sidewalls are separated by a distance corresponding to the width of the bottom surface of the trough. The at least one trough has at least one open end. The process comprises a second step of providing a linear substantially symmetrical A-b-B di-block copolymer. The process further comprises a third step of forming a film comprising the A-b-B di-block copolymer inside the at least one trough. The lateral position of a line-forming micro-domain in the trench is controlled by the distance between the at least one open end of the trough and the at least one edge of the mesa. The distance is about 0.5 P to about 1.0 P, wherein P refers to the lamellar domain period of the A-b-B di-block copolymer. The edge pins one block of the di-block copolymer. The process further comprises a fourth step of assembling micro-domains of the di-block copolymer within the film. The micro-domains form self-assembled structures. Preferably, the structures are nanostructures. The structures are oriented substantially normal to the first sidewall and the second sidewall, and oriented substantially perpendicular to the surface layer. The process comprises a fifth step of removing at least one micro-domain from the film to obtain an oriented structure in the trough. The structure is oriented substantially normal to the first sidewall and second sidewall, and substantially perpendicular to the surface layer. The oriented structure comprises a pattern consisting essentially of an array of substantially parallel lines. The array of substantially parallel lines has a sub-lithographic dimension. Preferably, the array of substantially parallel lines is a nanoarray. The oriented structure (nanoarray of substantially parallel lines) is controlled in both alignment and registration (lateral position within the trough).

Referring to FIG. 1, a first topographic laminate 1 is represented. A substrate 10 supports a first topographic "phase pinning" pattern 20 and a second topographic "guiding" pattern 30. The first topographic "phase pinning" pattern 20, having the morphology of a mesa or ledge, contains an edge 60. In FIG. 1, the edge 60 of the mesa is positioned at a functional distance 5 from an open end of the trough. Preferably, the substrate 10 can be a material of the IUPAC group 11, 12, 13 and 14 elements; plastic materials, silicon dioxide, glass fused silica, mica, ceramic, metals deposited on the aforementioned substrates, combinations thereof and the like. Preferably, the distance between the open end of the trough in the second topographic pattern 30 and the edge 60 of the mesa in the first topographic pattern 20 is about 0.5 P to about 1.0 P. In an alternative embodiment, the substrate 10 can be a laminate. The first topographic "phase pinning" pattern 20 can be formed either before formation of the second topographic "guiding" pattern 30 or, in the alternative, after formation of the second topographic "guiding" pattern 30. The first topographic pattern 20 can be formed by any photolithographic technique known to one of ordinary skill in the art. A photoresist is employed to produce the first topographic pattern 20. The photoresist material can be any material known to one of ordinary skill in the art. Preferably, the photoresist is a thermoplastic polymer or copolymer that can be crosslinked by means of heat, UV light, visible light or the like. The second topographic pattern 30 comprises the morphology of a trough. As stated above, the trough is comprised of two sides 110, and a bottom surface 120. The two sidewalls 110 and the bottom surface 120 are made energetically neutral by a process known to one of ordinary skill in the art. The first topographic pattern 20 is "phase pinning" because a di-block copolymer (one that is able to self-assemble into lamellar micro-domains) can be "pinned" by an edge 60 of the first topographic pattern 20. The edge 60 of the first topographic "phase pinning" pattern 20 is formed by a first topographic pattern 20 having the morphology of a mesa or ledge. In FIG. 1, the edge 60 of the mesa is positioned at a functional distance 5 from an open end of the trough. The edge 60 can pin one of the blocks of a di-block copolymer (not shown). The "pinning" action performed by the first topographic pattern allows for controlled lateral placement of a self-assembling di-block copolymer. The controlled lateral placement is not achieved in the prior art. Such control can be obtained using patterns of length scales accessible with optical lithography.

Figure 2:
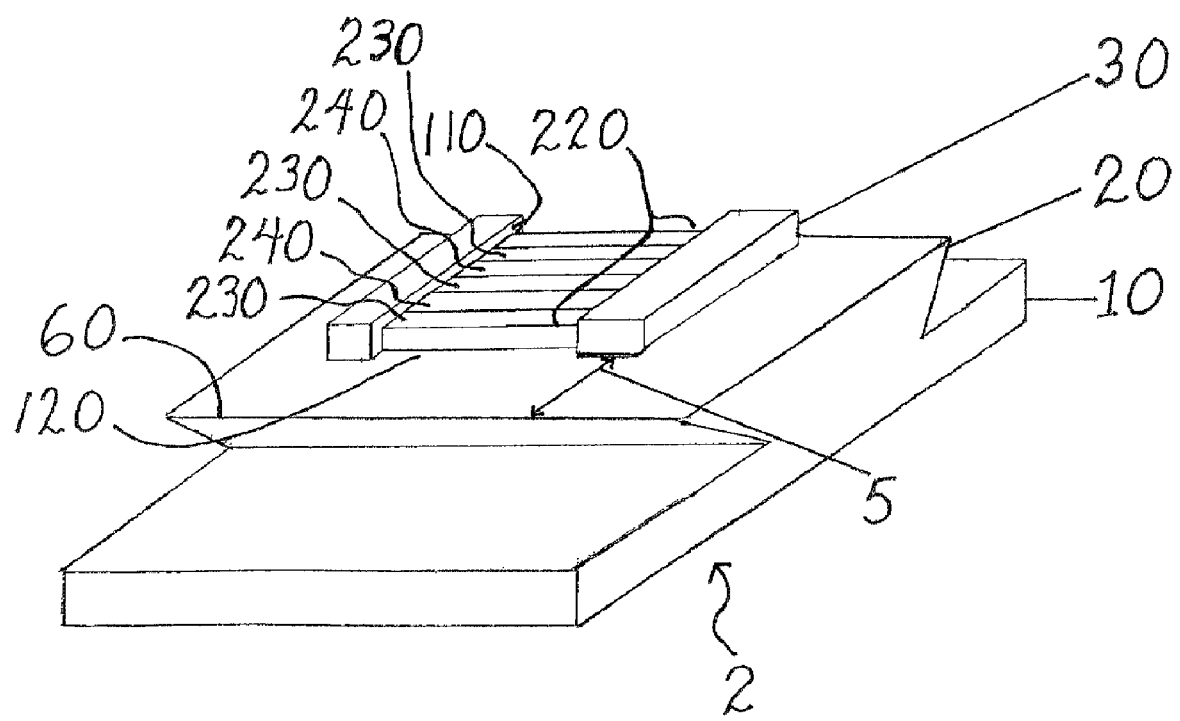
FIG. 2 is a schematic representation of a second topographic laminate that comprises a substrate, a first topographic pattern that acts as a phase pinning pattern, a second topographic pattern that acts as a guiding pattern, and a pinned di-block copolymer that has assembled into lamellar micro-domains.

Referring to FIG. 2, a second topographic laminate 2 is represented. A substrate 10 supports a first topographic "phase pinning" pattern 20 and a second topographic "guiding" pattern 30. The first topographic "phase pinning" pattern 20, having the morphology of a mesa or ledge, contains an edge 60. In FIG. 2, the edge 60 of the mesa is positioned at a functional distance 5 from an open end of the trough. The trough is comprised of two sides 110 and a bottom surface 12. Preferably, the distance 5 between the open end of the trough in the second topographic pattern 30 and the edge 60 of the mesa in the first topographic pattern 20 is about 0.5 P to about 1.0 P. Preferably, the substrate 10 can be a material of the IUPAC group 11, 12, 13 and 14 elements; plastic materials, silicon dioxide, glass fused silica, mica, ceramic, metals deposited on the aforementioned substrates, combinations thereof and the like. The substrate 10 can also be a laminate. The first topographic "phase pinning" pattern 20 can be formed either before formation of the second topographic "guiding" pattern 30 or, in the alternative, after formation of the second topographic "guiding" pattern 30. A photoresist is employed to produce the first topographic pattern 20. The photoresist material can be any material known to one of ordinary skill in the art. Preferably, the photoresist is a thermoplastic polymer or copolymer that can be crosslinked by means of heat, UV light, visible light or the like. The second topographic pattern 30 comprises the morphology of a trough which is comprised of two sides 110, and a bottom surface 120. The first topographic pattern 20 is "phase pinning" because a di-block copolymer (one that is able to self-assemble into lamellar micro-domains) can be "pinned" by an edge 60 of the first topographic pattern 20. The edge 60 of the first topographic phase pinning pattern 20 is formed in a first topographic pattern 20 having the morphology of a mesa or ledge. In FIG. 2, the edge 60 of the mesa is positioned at a functional distance 5 from an open end of the trough. The bottom surface 120 and the two sidewalls 110 of the trough are made energetically neutral. Once the trough is made energetically neutral, the surface of the first and second topographic pattern can be coated with a self-assembling di-block copolymer 220. The edge 60 can pin one of the blocks of the di-block copolymer 220. The di-block copolymer 220 comprises alternating lamellae 230 and 240 formed by self-assembly of the two distinct blocks of the copolymer. One block of the di-block copolymer assembles to form lamellae 230 and the second block of the di-block copolymer assembles to form lamellae 240. The "pinning" action performed by the first topographic pattern 20 allows for controlled lateral placement of a self-assembling di-block copolymer. The controlled lateral placement (registration) is not achieved in the prior art. In the present invention, such control can be obtained using patterns of length scales accessible with optical lithography.

Figure 3:
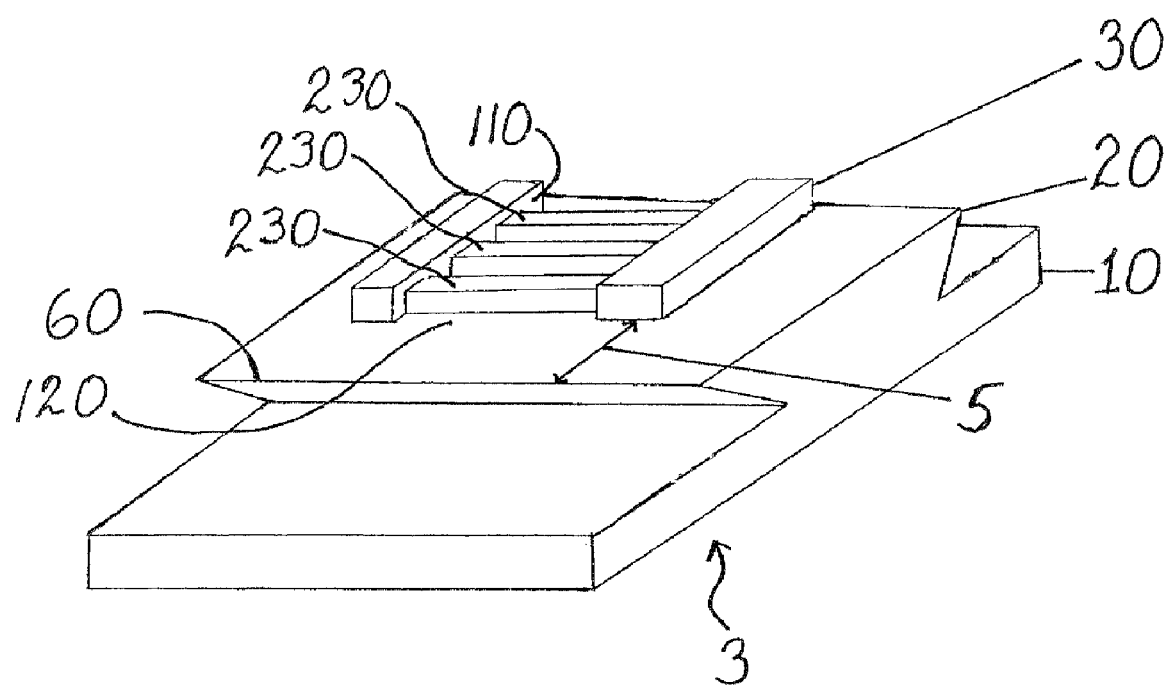
FIG. 3 is a schematic representation of a third topographic laminate that comprises a substrate, a first topographic pattern that acts as a phase pinning pattern, a second topographic pattern that acts as a guiding pattern, and a di-block copolymer that has one of the micro-domains removed.

Referring to FIG. 3, a third topographic laminate 3 is represented. A substrate 10 supports a first topographic "phase pinning" pattern 20 and a second topographic "guiding" pattern 30. The first topographic "phase pinning" pattern 20, having the morphology of a mesa or ledge, contains an edge 60. In FIG. 3, the edge 60 of the mesa is positioned at a functional distance 5 from an open end of a trough. The trough is comprised of two sides 110 and a bottom surface 120. Preferably, the functional distance 5 between an open end of the trough in the second topographic pattern and the edge of the mesa in the first topographic pattern is about 0.5 P to about 1.0 P. Preferably, the substrate 10 can be a material of the IUPAC group 11, 12, 13 and 14 elements; plastic materials, silicon dioxide, glass fused silica, mica, ceramic, metals deposited on the aforementioned substrates, combinations thereof and the like. The substrate 10 can also be a laminate. The first topographic "phase pinning" pattern 20 can be formed either before formation of the second topographic "guiding" pattern 30 or, in the alternative, after formation of the second topographic "guiding" pattern 30. A photoresist is employed to produce the first topographic pattern 20. The photoresist material can be any material known to one of ordinary skill in the art. Preferably, the photoresist is a thermoplastic polymer or copolymer that can be crosslinked by means of heat, UV light, visible light or the like. The second topographic pattern 30 comprises a trough comprised of two sides 110, and a bottom surface 120. The first topographic pattern 20 is "phase pinning" because a di-block copolymer (one that is able to self-assemble into lamellar micro-domains) can be "pinned" by an edge 60 of the first topographic pattern 20. The edge 60 of the first topographic "phase pinning" pattern 20 is formed in a first topographic pattern 20 having the morphology of a mesa or ledge. In FIG. 3, the edge 60 of the mesa is positioned at a functional distance 5 from an open end of the trough. The bottom surface 120 and the two sidewalls 110 of the trough are made energetically neutral. Once the trough is made energetically neutral, the surface of the first and second topographic pattern can be coated with a film of a self-assembling di-block copolymer 220 (See FIG. 2). Preferably, an annealing step is performed on the film to obtain equilibrium morphology. The edge 60 can pin one of the blocks of the di-block copolymer. The "pinning" action performed by the first topographic pattern 20 allows for controlled lateral placement of a self-assembling di-block copolymer. The controlled lateral placement is not achieved in the prior art. In the present invention, such control can be obtained using patterns of length scales accessible with optical lithography. One type of block of the di-block copolymer is then removed by methods known to one of ordinary skill in the art. After removal of blocks 240 (See FIG. 2), only blocks 230 remain. A pattern of alternating lines and spaces is thus obtained. The pattern can be employed as a mask to etch the underlying substrate.

Figure 4:
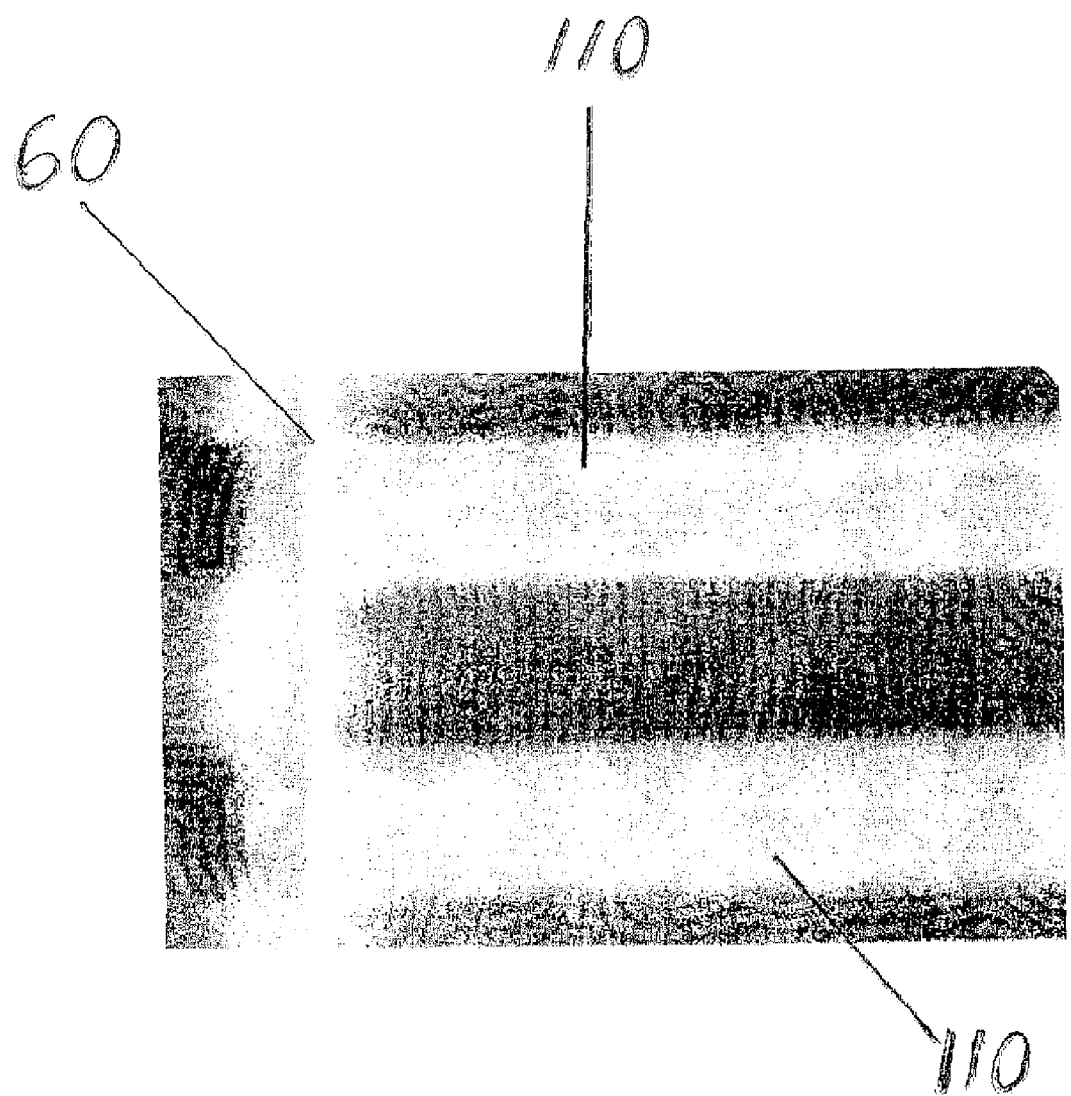
FIG. 4 is a plan-view scanning electron microscope (SEM) micrograph of lamellar micro-domains of a polystyrene-b-polymethylmethacrylate (PS-b-PMMA) di-block copolymer wherein the alignment and the registration of the lamellar micro-domains are controlled by the topographic laminate.

Referring to FIG. 4, a plan-view scanning electron microscope (SEM) micrograph of lamellar micro-domains of a polystyrene-b-polymethylmethacrylate (PS-b-PMMA) di-block copolymer deposited on the top of a topographic laminate is depicted. The polystyrene-b-polymethylmethacrylate di-block copolymer was coated as a film on a topographic laminate. In particular, the coating solution comprised 38 kg/mol PS and 36.8 kg/mol PMMA. The edge 60 of the mesa pins one phase of micro-domains while sidewall 110 aligns the lamellar micro-domains perpendicular to the sidewall surface.

The present invention, in one embodiment, relates to a method for preparing a polymer structure consisting essentially of self assembled lamellar microdomains. The polymer structure has a sub-lithographic dimension. The method comprises the following steps. A substrate having an energetically neutral surface layer is obtained. The energetically neutral surface layer comprises a first topographic "phase pinning" pattern and a second topographic "guiding" pattern. The first topographic "phase pinning" pattern comprises a mesa having an edge. The second topographic "guiding" pattern comprises a trough. The trough has at least one open end. The trough cannot be closed off like a box structure. The distance between the at least one open end of the trough and the edge of the mesa is about 0.5 P to about 1.0 P. The symbol P refers to the lamellar domain period of a di-block copolymer.

The method further comprises a step of obtaining a self-assembling di-block copolymer. The self-assembling di-block copolymer is then coated on the energetically neutral surface. The edge of the mesa pins one block of the di-block copolymer. A coated substrate is obtained.

The method further comprises a step of annealing the coated substrate to obtain self-assembled micro-domains of the di-block copolymer; wherein the microdomains are controlled in both alignment and registration (lateral position within the trough). A polymer structure consisting essentially of self assembled lamellar microdomains is thus obtained.

One type of block of the self-assembled lamellar microdomains is then removed as by etching or the like. A pattern of alternating lines and spaces is thereby obtained. Such a pattern can be employed as a mask to etch the underlying substrate. The width of the lines can be about 10 nm to about 100 nm.

While the invention has been described by specific examples and embodiments, there is no intent to limit the inventive concept except as set forth in the following claims.

We claim:

1. A method for preparing a line/space array comprising:
   obtaining a substrate having an energetically neutral surface layer, the energetically neutral surface layer comprising a first topographic "phase pinning" pattern and a second topographic "guiding" pattern; the first topographic "phase pinning" pattern comprising a mesa having an edge; the second topographic "guiding" pattern comprising a trough, the trough having at least one open end; wherein the distance between the at least one open end of the trough and the edge of the mesa is about 0.5 P to about 1.0 P, and wherein P refers to the lamellar domain period of a di-block copolymer;
   providing a self-assembling di-block copolymer;
   coating the self-assembling di-block copolymer on the energetically neutral surface to obtain a coated substrate, wherein the edge pins one block of the di-block copolymer;
   annealing the coated substrate to obtain a polymer structure consisting essentially of self-assembled lamellar micro-domains of di-block copolymer; wherein the micro-domains are controlled in both alignment and registration (lateral position in the trough); and
   removing one type of block of the self-assembled lamellar micro-domains to obtain a pattern of alternating lines and spaces, wherein the pattern comprises the line/space array.

2. The method according to claim 1 wherein the width of the lines in the line/space array is between about 10 nm and about 100 nm.

3. The method according to claim 1 wherein the substrate comprises a silicon wafer, wherein a layer of silicon dioxide is disposed thereupon.

4. The method according to claim 1 wherein the trough has a width between about 100 nm and about 500 nm.

5. The method according to claim 1 wherein the self-assembling di-block copolymer is a styrene-methyl methacrylate di-block copolymer.

6. The method according to claim 1 wherein the removing step comprises etching the polymer structure.

7. The method according to claim 1 wherein the coating step comprises spin casting a mixture selected from the group consisting of i) a solution of di-block copolymer and a solvent, and ii) a dispersion of di-block copolymer and a solvent.

8. A method of treating a substrate to form a composite comprising a first topographic pattern and a second topographic pattern positioned on the substrate, wherein the composite is useful for receiving a coating of a self-assembling di-block copolymer, the method comprising:
   obtaining a substrate selected from the group consisting of plastic material, silicon dioxide, glass, fused silica, mica, ceramic materials, materials of the Group I, II, III and IV elements, metals deposited on the aforementioned substrates and combinations thereof; and
   forming an energetically neutral surface layer on the substrate, the energetically surface layer comprising a first topographic "phase pinning" pattern and a second topographic "guiding" pattern; the first topographic "phase pinning" pattern comprising a mesa having an edge; the second topographic "guiding" pattern comprising a trough, the trough having at least one open end; wherein the distance between the at least one open end of the trough and the edge of the mesa is about 0.5 P to about 1.0 P, wherein P is the lamellar domain period of the self-assembling di-block copolymer.

9. The method according to claim 8 further comprising coating the self-assembling di-block copolymer on the energetically neutral surface to obtain a coated substrate, wherein the edge pins one block of the self-assembling di-block copolymer.

10. The method according to claim 9 further comprising annealing the coated substrate to obtain a polymer structure consisting essentially of self-assembled lamellar micro-domains of di-block copolymer; wherein the micro-domains are controlled in both alignment and registration (lateral position in the trough).

11. The method according to claim 10 further comprising removing one type of block of the self-assembled lamellar micro-domains to obtain a pattern of alternating lines and spaces, wherein the pattern has a characteristic dimension between about 10 nm and about 100 nm.

12. The method according to claim 11 wherein the pattern of alternating lines and spaces is employed in processes for preparing an integrated circuit feature selected from the group consisting of a gate, a via and an interconnect.

* * * * *